(12) United States Patent
Wang (10) Patent No.: US 6,251,719 B1
(45) Date of Patent: Jun. 26, 2001

(54) POLY GATE PROCESS THAT PROVIDES A NOVEL SOLUTION TO FIX POLY-2 RESIDUE UNDER POLY-1 OXIDE FOR CHARGE COUPLED DEVICES

(75) Inventor: Jen Pan Wang, Tainan County (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/713,838

(22) Filed: Nov. 16, 2000

(51) Int. Cl.⁷ .................. H01L 21/8234; H01L 21/8242; H01L 21/4763; H01L 21/44
(52) U.S. Cl. ................ 438/238; 438/241; 438/258; 438/592; 438/682
(58) Field of Search .................. 438/241, 258, 438/592, 682, 238, 352, 303; 257/350, 347, 348, 351, 352, 369, 903

(56) References Cited

U.S. PATENT DOCUMENTS

| | | | |
|---|---|---|---|
| 5,114,872 | * | 5/1992 | Roselle et al. ............ 437/48 |
| 5,340,754 | * | 8/1994 | Witek et al. ............... 437/32 |
| 5,366,913 | * | 11/1994 | Nakao ........................ 437/41 |
| 5,393,681 | * | 2/1995 | Witek et al. ............... 437/40 |
| 5,516,716 | * | 5/1996 | Hawkins et al. ........... 437/53 |
| 5,527,723 | * | 6/1996 | Witek et al. ............... 437/40 |
| 5,627,395 | * | 5/1997 | Witek et al. .............. 257/350 |
| 5,898,619 | * | 4/1999 | Chang et al. ............. 257/316 |
| 5,949,706 | * | 9/1999 | Chang et al. ............. 365/156 |
| 5,998,249 | * | 12/1999 | Liaw et al. ............... 438/228 |
| 6,015,730 | * | 1/2000 | Wang et al. .............. 438/241 |

* cited by examiner

*Primary Examiner*—Michael Lebentritt
(74) *Attorney, Agent, or Firm*—George O. Saile; Stephen B. Ackerman (57) ABSTRACT

A new method is provided for the creation of poly gate electrodes. A layer of poly-1 is deposited over the surface of a layer of ONO, a layer of TEOS-1 is deposited over the layer of poly-1. The layer of TEOS-1 is patterned in accordance with the pattern of the gate electrodes, the layer of poly-1 is dry etched using the patterned layer of TEOS-1 as a hard mask after which the layer of TEOS-1 forms a top IPO layer for the gate structure. A layer of silicon nitride is deposited over the pattern of gate electrodes, a layer of TEOS-2 is deposited over the surface of the layer of silicon nitride. The layer of TEOS-2 is etched applying a dry etch using the layer of silicon nitride as an etch stop thereby forming gate spacers on the sidewalls of the gate electrodes. The silicon nitride is next removed from the surface of the gate electrodes and from between the gate spacers by applying a silicon nitride wet etch. A buffer oxide etch (BOE) or HF wet dip removes the top oxide layer of the layer of ONO from between the gate spacers after which a layer of HTO is redeposited over the structure including the surface of the gate electrode (which is the exposed layer of TEOS-1), the gate spacers (formed of silicon nitride over which remains TEOS-2) and the opening that has been created in the layer of ONO. The layer of poly-2 is now deposited, completing the formation of the poly-1/poly-2 layers that from part of gate electrodes structures.

35 Claims, 5 Drawing Sheets

POLY GATE PROCESS THAT PROVIDES A NOVEL SOLUTION TO FIX POLY-2 RESIDUE UNDER POLY-1 OXIDE FOR CHARGE COUPLED DEVICES

BACKGROUND OF THE INVENTION (1) Field of the Invention

The invention relates to the fabrication of integrated circuit devices, and more particularly, to a method of preventing poly-2 residue that typically remains in place under a layer of poly-1 oxide in applications where two layers of poly are used to form a gate electrode, such as in Charge Coupled Device (CCD) applications.

(2) Description of the Prior Art

In the manufacturing of semiconductor devices a number of different but interacting disciplines are used that collectively create high performance semiconductor devices. The majority of these semiconductor devices have as function the processing of digital information, which is characterized by zero and one conditions, typically created by on-off conditions of switching transistors. In addition, hybrid functions can be provided that address not only the processing of digital signals but also address the processing of analog signals, either as a function that is provided by one analog semiconductor device or in collaboration with digital devices. Device performance improvements have been sought and established by continuously decreasing device dimensions, concurrently increasing device packaging density. This poses problems for a number of the typical analog components such as capacitors and inductors that have physical dimensions that do not lend themselves to ready integration into a highly miniaturized, sub-micron device environment.

The mixing of functions and processing capabilities results in a mixing of components that coexist within one semiconductor device. It is therefore not uncommon to see resistors and capacitors that form part of a semiconductor device, which does not negate that the vast majority of device components is made up of transistors, gate electrodes and a variety of switching components that address logic processing functions. Capacitors can for instance form a basic component of analog circuits that are used for analog applications such as switched capacitor filters. Capacitors are also widely applied in digital applications such as the storage node for Dynamic Random Access Memory (DRAM) circuits. This ability of capacitors to function in either the digital or the analog mode is referred to as the mixed mode application of the capacitor.

The DRAM technology is widely used for data storage where one transistor and one capacitor form one DRAM cell. For the capacitor a stacked capacitor is frequently used, since this structure has good data storage performance characteristics combined with low surface space requirements. To fabricate a DRAM device, a modified CMOS process is typically used. One other application in which the CMOS structure has been successfully applied is in the creation of image sensors. An image sensor is, in its broadest terms, used to convert an optical image that is focused on the sensor into electrical signals. The image sensor typically includes an array of light detecting elements, where each element produces a signal corresponding to the intensity of light impinging on that element when an image is focused on the array. These signals may then be used, for example, to display a corresponding image on a monitor or may otherwise be used to provide information about the optical image.

One frequently used type of image sensor is a charge-coupled device (CCD). Integrated circuit chips containing CCD image sensors have a relatively low yield and are expensive due to the specialized processing involved. CCD devices also consume a relatively large amount of power.

A much less expensive type of image sensor can be formed as an integrated circuit by using a CMOS process. In such a CMOS type image sensor, a photodiode or phototransistor (or any other suitable device) is used as the light-detecting element, where the conductivity of the element corresponds to the intensity of light impinging on the element. The variable signal thus generated by the light detecting element is an analog signal with a magnitude that is approximately proportional (within a certain range) to the amount of light that impinges on the element.

Light-detecting elements are typically formed in a two-dimensional core array, which is addressable by row and column. Once a row of elements has been addressed, the analog signals from each of the light detecting elements in the row are coupled to the respective columns in the array. An analog-to-digital converter may then be used to convert the analog signals of the columns to digital signals so as to provide only digital signals at the output of the image sensor chip.

What is needed is an inexpensive, but highly efficient, image sensor, which produces reliable images. Implied in this is that leakage current in the spacer regions, that is the source/drain regions of the CMOS gate electrode of the image sensor, is reduced to a minimum. Potential plasma damage that can be caused during the spacer etching must therefore be kept at a minimum.

Conventional semiconductor CCD image sensors often employ a double polysilicon gate structure that forms a gate electrode array structure. Such a structure has a first polysilicon gate electrode that is separated from a second polysilicon gate electrode by a thin insulation layer of silicon dioxide. The first poly electrode is slightly overlapped by the second poly electrode. The systematic variations of potential that are applied to these electrodes, which are referred to as clocking, permits the device to function. In the case of a frame transfer CCD image sensor, light passes through the poly electrodes and creates electronic hole pairs in the underlying silicon. By clocking electrodes, the accumulated electrons are moved under adjacent electrodes. Light must pass through the polysilicon electrodes in order to accumulate charge. However, polysilicon is not entirely transparent, which results in a reduction of sensitivity and a spectral response of the image sensor.

Figure 1A:
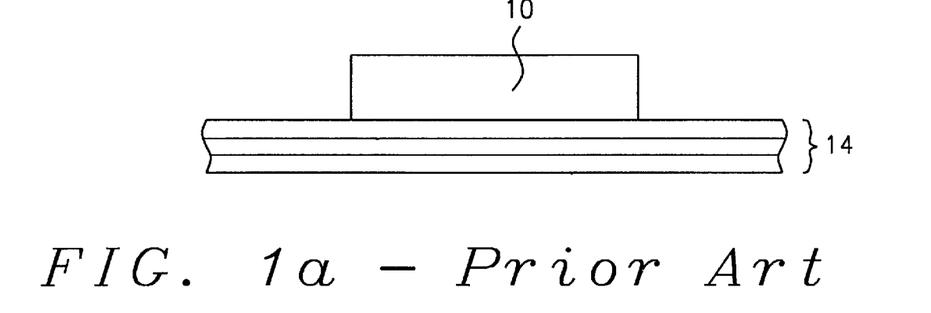
FIG. 1a shows a cross section of a layer of ONO over which a layer of poly-1 has been deposited and patterned.
Figure 1B:
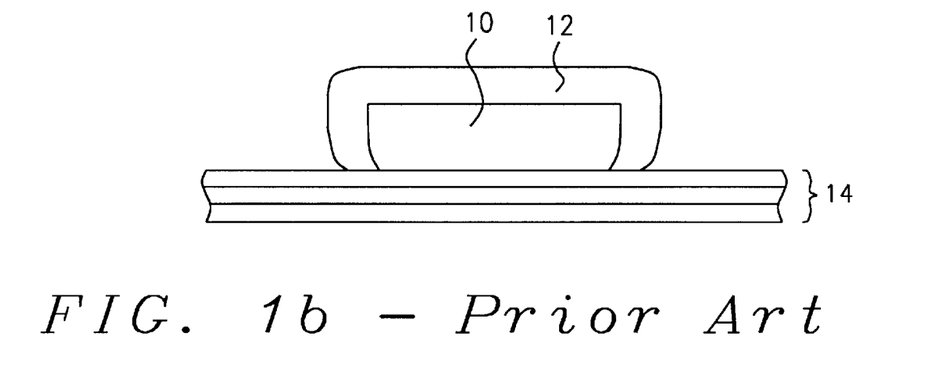
FIG. 1b shows a cross section of the patterned layer of poly-1 after wet thermal oxidation of the layer.
Figure 1C:
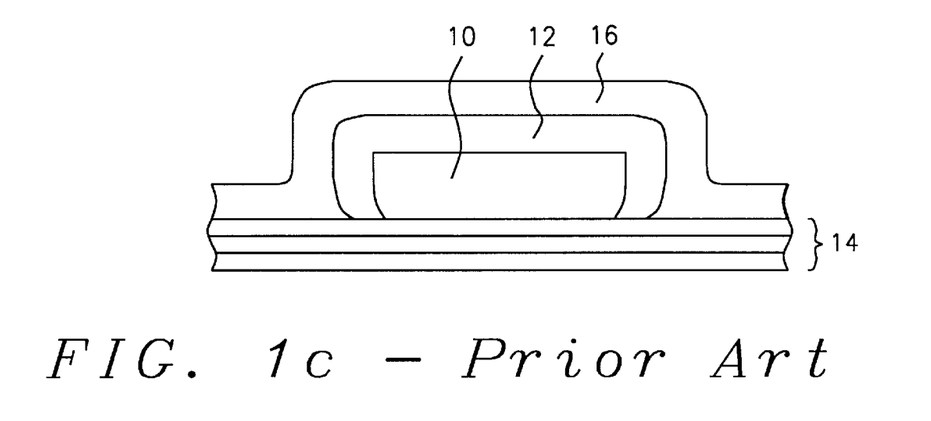
FIG. 1c shows a cross section after a layer of poly-2 has been deposited.
Figure 1D:
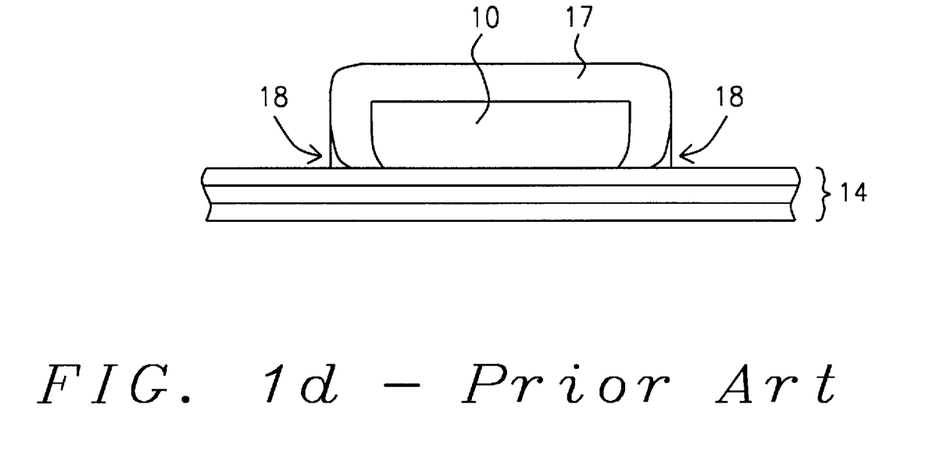
FIG. 1d shows a cross section after the deposited layer of poly-2 has been patterned (dry etched) to form spacers on the sidewalls of the gate electrode.

FIGS. 1a through 1e show a Prior Art gate electrode with the etching of the spacer, as follows:

FIG. 1a shows the polysilicon (poly-1) gate electrode 10 that has been created over the top surface of a layer 14 of ONO. FIG. 1a shows the initial processing steps to create a gate electrode, as follows:

ONO layer 14 deposition poly-1 layer 10 deposition, and patterning and etching of layer 10 of poly-1 applying a dry etch thereby forming the initial stage of the gate electrode FIG. 1b through 1d show the results of performing:

1) FIG. 1b, a wet thermal oxidation of the surface of the created layer 10 of poly-1 thereby creating a poly oxidation layer 12; layer 12 of oxidized poly-1 serves as a layer of Inter Poly Oxide (IPO) that separates two layers of poly, that is layer 10 of poly-1 and there thereover deposited 2) FIG. 1c, layer 16 of poly-2, and 3) FIG. 1d, the application of a poly-2 (layer 16, FIG. 1c) dry etch thereby creating the spacers 17 for the gate electrode 10.

Although typically the layer 16 (FIG. 1c) of poly-2 can be etched by applying a wet etch, there are semiconductor manufacturing facilities where the process of wet etch of polysilicon is no longer available in advanced Integrated Circuit facilities and where therefore a dry etch must be performed for the layer 16 of poly-2. This latter etch of the layer 16 of poly-2 creates, as already stated, the spacers for the poly-1 gate electrode 10, whereby deposits 18 of poly-2, FIG. 1d, remain in place raising the potential of causing electrical shorts between adjacent poly-2 gates 15, FIG. 1e. The process of the invention therefore provides a method whereby the layer of poly-2 can be etched applying a dry etch where this application of the dry etch does however not result in poly-2 residue remaining in place adjacent to the gate spacers and therefore prevents the poly-2 of gate 15 from connecting (shorting) with adjacent poly-2 gates through the path of the poly-2 residue 18.

The problems that have been experienced following the processing sequence that is shown in FIGS. 1a through 1d has been highlighted in FIG. 1d, where poly-2 residue 18 remains in place. This process does apply the method of dry etch for the etch of the layer 16 of poly-2. It is desired to continue to be able to use the dry etch for the spacer formation, however it is not acceptable that this dry etch results in poly-2 residue remaining in place adjacent to the spacer of the gate electrode. The poly-2 residue 18 reduces the isolation of the gate electrodes that is typically provided by the gate spacers on the sidewalls of the gate electrode 10. This reduction in isolation has resulted in shorts between the adjacent gate electrodes 15, FIG. 1e. The process of the invention provides a method whereby residue 18 is, among other advantages, eliminated.

Figure 1E:
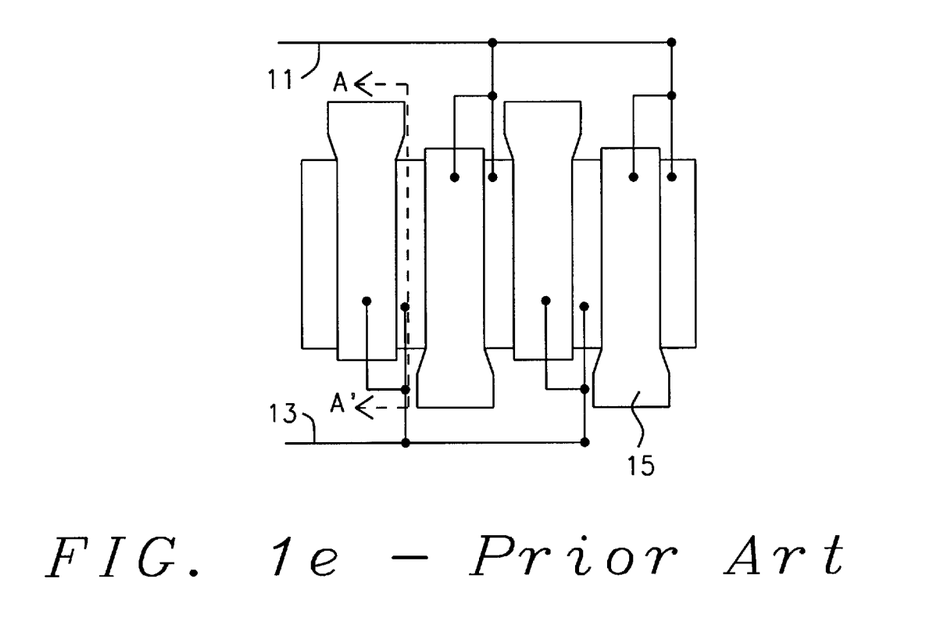
FIG. 1e shows a top view of where the problems of residual poly-2 occur in the surface of a pattern of gate electrodes.

FIG. 1e further shows a top view of the regions where the residual poly-2 forms whereby regions 11 and 13 indicate the regions of opposite adjacency to the gate electrodes 15 where the problem of residual poly-2 is most typically observed. The cross sections that have been shown in FIGS. 1a through 1d are cross sections that have been taken along the line A–A' of FIG. 1e.

Figure 2:
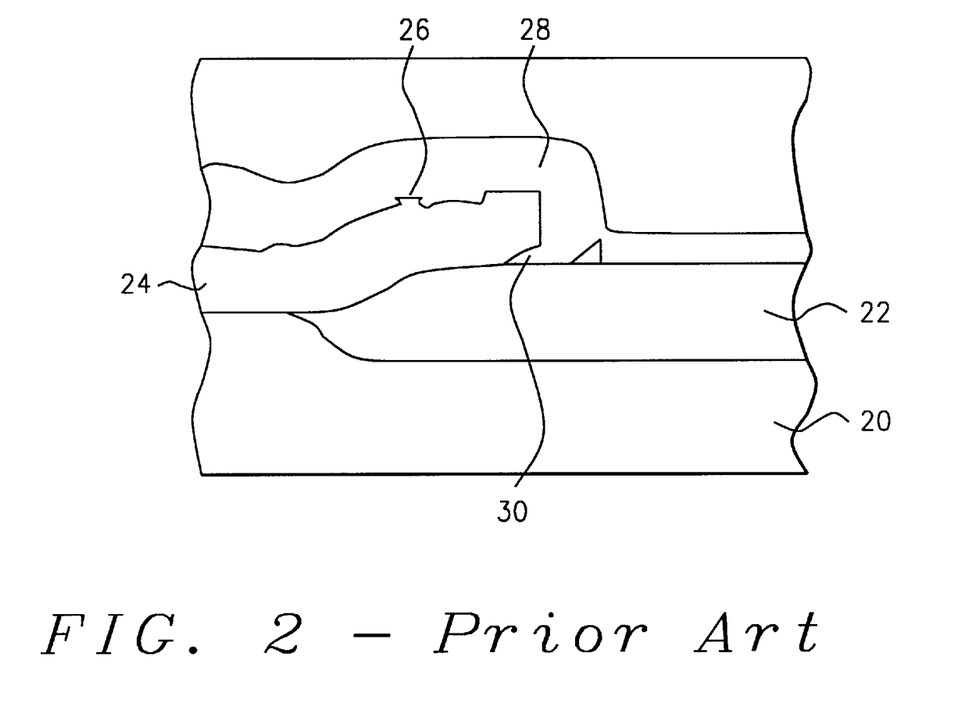
FIG. 2 shows a cross section of a Prior Art created gate electrode that further highlights the occurrence of residual poly-2 after the dry etch of the deposited layer of poly-2.

FIG. 2 further shows the poly-2 that remains in place under the poly-1, the regions that have been highlighted in FIG. 2 are as follows:

20 is the surface of a silicon substrate over which a gate electrode is to be formed 22 is a field isolation region that defines that active region in the surface of the silicon substrate 20

24 is a deposited and patterned layer of poly-1 that forms the body of the gate electrode 26 is the layer of IPO that has been formed using a wet thermal oxidation process 28 is the layer of inter poly oxide (IPO) that has been formed over the surface of the layer 24 of poly-1; and 30 is the poly-2 residue that remains in place under the poly-1 layer 24 after dry etching of the layer 28 of poly-2, this dry etch is performed to create the gate electrode including the gate spacers on the sidewalls of the layer 24 of poly-1.

U.S. Pat. No. 6,015,730 (Wang et al.) shows a SAC process.

U.S. Pat. No. 5,998,249 (Liaw et al.) shows a dram SAC process and spacers.

U.S. Pat. No. 5,114,872 (Roselle et al.) teaches a contact process with SiN spacers.

U.S. Pat. No. 5,366,913 (Nakao) shows an oxide sidewall process.

U.S. Pat. No. 5,516,716 (Hawkins et al.) discloses a Charge Coupled Device (CCD) process.

SUMMARY OF THE INVENTION

A principle objective of the invention is to provide a method of forming spacers on the sidewalls of gate electrodes by applying a process of dry etching of a layer of poly-2 without thereby incurring of residual poly-2 that typically remains in place after the process of dry etching the layer of poly-2.

Another objective of the invention is to reduce gate electrode device electrical shorts due to the presence of residual poly-2 underneath the spacers of the gate electrode.

Yet another objective of the invention is to provide a method whereby the thickness of layers of IPO can be independently adjusted in a vertical and in a horizontal direction.

Yet another objective of the invention is to provide a method whereby the parasitic capacitance that is typically introduced by the introduction of IPO layers can be effectively reduced, improving gate electrode device high-frequency performance.

Yet another objective of the invention is to provide a method whereby the fringe field of a gate electrode can be increased thereby improving the Charge Transfer Efficiency (CTE) of the gate electrode device.

In accordance with the objectives of the invention a new method is provided for the creation of poly gate electrodes. A layer of poly-1 is deposited over the surface of a layer of ONO, a layer of TEOS-1 is deposited over the layer of poly-1. The layer of TEOS-1 is patterned in accordance with the pattern of the gate electrodes, the layer of poly-1 is dry etched using the patterned layer of TEOS-1 as a hard mask after which the layer of TEOS-1 forms a top IPO layer. A layer of silicon nitride is deposited over the pattern of gate electrodes, a layer of TEOS-2 is deposited over the surface of the layer of silicon nitride. The layer of TEOS-2 is etched applying a dry etch using the layer of silicon nitride as an etch stop thereby forming gate spacers on the sidewalls of the gate electrodes. The silicon nitride is next removed from the surface of the gate electrodes and from between the gate spacers by applying a silicon nitride wet etch. A buffer oxide etch (BOE) or HF wet dip removes the top oxide layer of the layer of ONO from between the gate spacers after which a layer of HTO is redeposited over the structure including the surface of the gate electrode (which is the exposed layer of TEOS-1), the gate spacers (formed of silicon nitride over which remains TEOS-2) and the opening that has been created in the layer of ONO. The layer of poly-2 is now deposited, completing the formation of the poly-1/poly-2 layers that from part of gate electrodes structures.

BRIEF DESCRIPTION OF THE DRAWINGS

FIGS. 1a through 1e show a cross section of a Prior Art formation of a poly gate electrode, as follows:

FIGS. 3 through 8 address the process of the invention, as follows:

Figure 3:
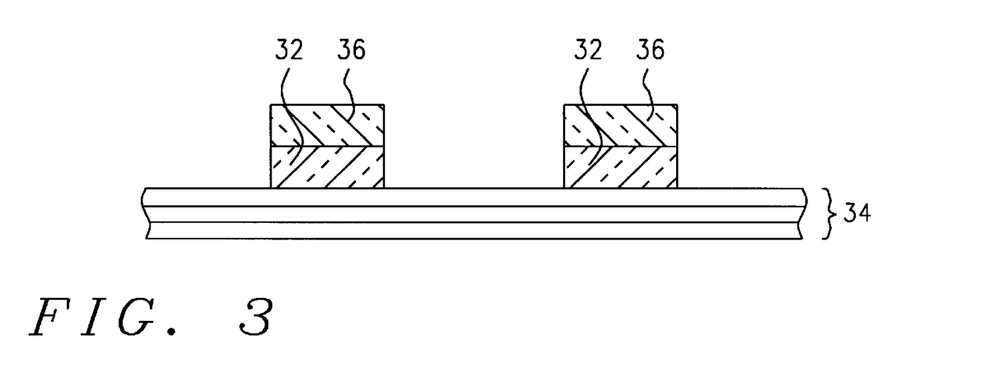
FIG. 3 shows a cross section after a layer of poly-1 has been deposited over a layer of ONO and patterned using a layer of TEOS-1 as a hard mask during the process of etch of the layer of poly-1; the layer of TEOS-1 remains in place as the IPO top layer.
Figure 8:
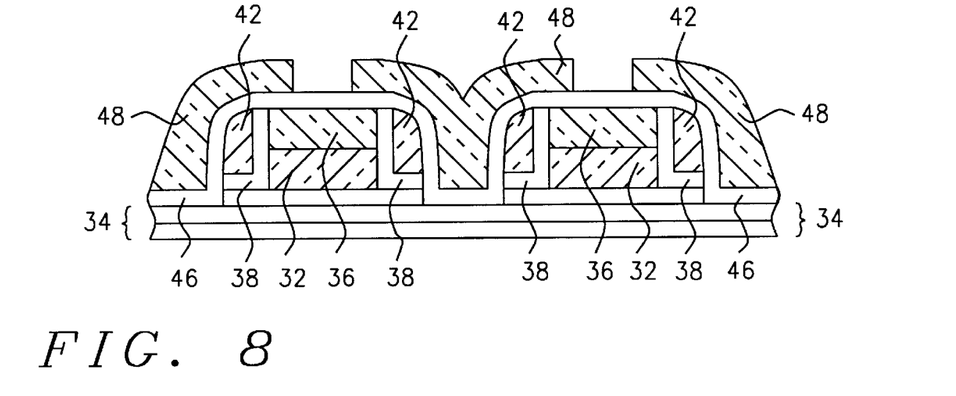
FIG. 8 shows a cross section after a layer of HTO has been re-deposited and a layer of poly-2 has been deposited.

After the completion of the steps shown in FIG. 3 up through the processing step shown in FIG. 8, the composite layer of ONO that is present under the patterned layers of poly-1 and poly-2 remains the same and remains in place as is, thereby eliminating the previously experienced problem of residual poly-2 adjacent to the gate spacers.

DESCRIPTION OF THE PREFERRED EMBODIMENTS

Referring now specifically to FIG. 3, there is shown a cross section after a layer 32 of poly-1 has been deposited over a layer 34 of ONO and patterned using a layer 36 of TEOS-1 (tetraethosiloxane) as a hard mask during the process of etch of the layer 32 of poly-1; the layer 36 of TEOS-1 remains in place as the IPO top layer.

Layer 34 of ONO serves as the gate oxide layer for the gate electrodes that are to be created on the surface of a substrate (not shown). In depositing layer 34 of ONO, that is a layer of oxide-nitride-oxide, the first layer of oxide is native oxide or thermally grown oxide or CVD deposited oxide. The nitride is grown in a low power furnace at a temperature within the range of 600 to 700 degrees C. to a thickness within the range of between 40 and 400 Angstrom, the final oxidation layer is grown in a low power furnace at a temperature within the range between 600 and 800 degrees C. for a time period within the range between 30 and 120 minutes.

The layer 32 of poly-1 can be in situ doped poly deposited using LPCVD at a temperature between about 500 and 700 degrees C. to a thickness between about 500 and 700 angstrom, using silane as a source and with the addition of phosphine to provide the needed dopant.

The deposition of the layer 36 of TEOS uses conventional LP deposition technology and can, for instance, use TEOS as a source at a flow rate between about 60 and 150 sccm, a temperature between about 680 and 730 degrees C., a pressure between about 240 and 260 mTorr for a time of deposition of about 60 minutes. The preferred thickness of layer 36 of the TEOS-1 is between about 2000 and 4000 Angstrom. Layer 36 serves as the inter-poly dielectric top layer.

Typical etching conditions for the TEOS etch are as follows: etchant used: $CF_4/CHF_3$ at a flow rate about 25 sccm, a temperature of about 40 degrees C., a pressure of about 225 mTorr, time of the etch between about 160 and 220 seconds, rf power density about 400 Watts with no magnetic field applied.

For typical processes of the creation of gate electrodes, the lower part (the conductive part) of a gate electrode is either polysilicon or amorphous silicon or a combination of both. This layer may be in-situ doped with dopant atoms or ion implanted with dopant atoms to alter the conductivity pattern of this conductive layer.

Figure 4:
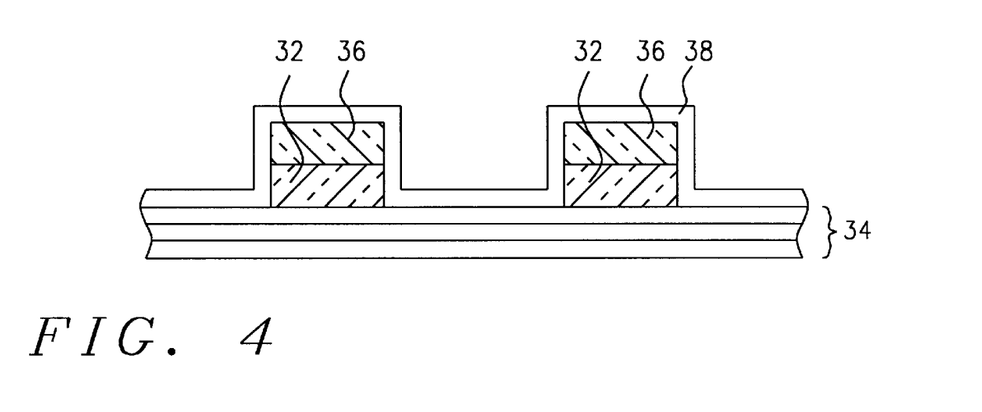
FIG. 4 shows a cross section after a layer of silicon nitride has been deposited over the pattern of gate electrodes.

FIG. 4 shows a cross section after a layer 38 of silicon nitride has been deposited over the pattern of gate electrodes. Silicon nitride is typically used as a passivation layer due to its ability to provide an impermeable barrier to moisture and mobile impurities (e.g. sodium ions). Silicon nitride also forms a tough coating that protects an underlying integrated circuit against mechanical damage. Silicon nitride is also frequently used as a stop layer for CMP polishing or as an etch stop.

The layer 34 of silicon nitride ($Si_3Ni_4$) can be deposited using PECVD procedures at a pressure between about 200 mTorr and 400 mTorr, at a temperature between about 350 and 450 degrees C., to a thickness of about 1000 to 5000 Angstrom using $NH_3$ and $SiH_4$ or $SiCl_2H_2$. The silicon nitride layer 34 can also be deposited using LPCVD or PECVD procedures using a reactant gas mixture such as dichlorosilane ($SiCl_2H_2$) as a silicon source material and amonia ($NH_3$) as a nitrogen source, at a temperature between about 600 and 800 degrees C., at a pressure between about 300 mTorr and 400 mTorr, to a thickness between about 200 and 400 Angstrom.

Figure 5:
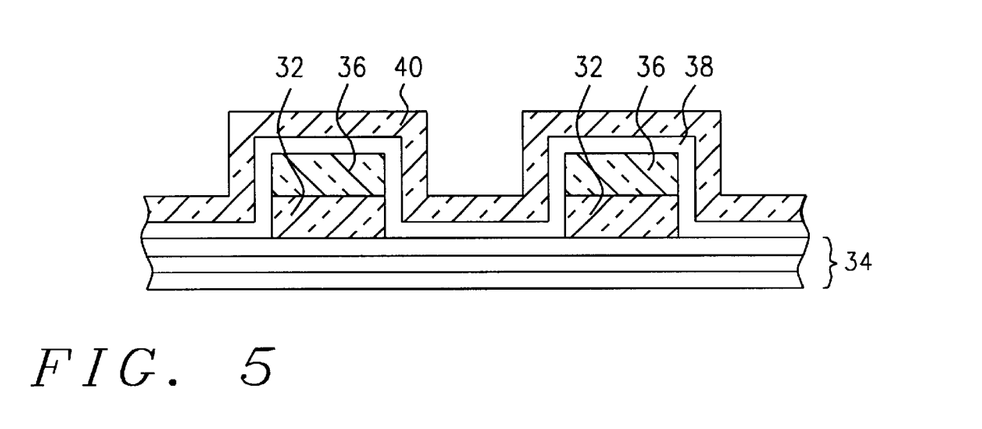
FIG. 5 shows a cross section after a layer of TEOS-2 has been deposited for the creation of gate spacers.

FIG. 5 shows a cross section after a layer 40 of TEOS-2 has been deposited for the creation of gate spacers. Gate spacers are typically formed using materials such as silicon nitride, silicon oxide, BSG, PSG, polysilicon, other materials preferably of a dielectric nature, CVD oxide formed from a TEOS source. Often used materials are amorphous materials that inhibit the deposition of epitaxial silicon thereupon. Spacers can for instance be formed by first depositing a layer of silicon oxide after which applying an anisotropic RIE procedure using $CHF_3$, $CF_4$ and $H_2$ as an etchant. The preferred material of the invention is to deposit a layer 40 of TEOS-2 deposited using conventional LP deposition technology and can, for instance, be deposited using TEOS as a source at a flow rate between about 60 and 150 sccm, a temperature between about 680 and 730 degrees C., a pressure between about 240 and 260 mTorr for a time of deposition of about 60 minutes. The preferred thickness of layer 40 of the TEOS-2 is between about 500 and 4000 Angstrom.

Figure 6:
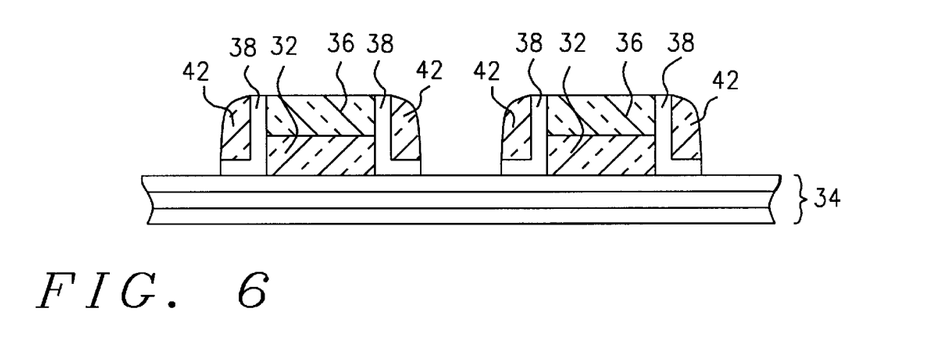
FIG. 6 shows a cross section after the layer of TEOS-2 has been partially etched stopping on the layer of silicon nitride, the silicon nitride has been removed from the surface of the gate electrodes and from between the gate spacers.

FIG. 6 shows a cross section after the layer 40 of TEOS-2 has been partially etched stopping on the layer 38 of silicon nitride. The partial etch of layer 40 of TEOS-2 has created the gate spacers 42 on the sidewalls of the gate electrodes. The process of etching the layer 40 of TEOS-2 again uses $CF_4/CHF_3$ as an etchant at a flow rate about 25 sccm, a temperature of about 40 degrees C., a pressure of about 225 mTorr, time of the etch between about 160 and 220 seconds, rf power density about 400 Watts with no magnetic field applied to the etch chamber.

Further shown in FIG. 6 is that the silicon nitride layer 38 has been removed from the surface of the gate electrodes 32/36 and from in between the spacers 42 above the layer 34 of ONO.

Typically, a layer of silicon nitride can be etched using a SiON or SiN removal process with etchant gasses $CH_3F/Ar/O_2$ at a temperature between about 10 and 20 degrees C., a pressure of between about 50 and 60 mTorr with an etch time of between about 40 and 60 seconds. A layer of silicon nitride can also be wet etched using hot phosphoric acid or by applying an anisotropic RIE procedure using $CHF_3$ or $SF_6$—$O_2$ as an etchant.

The preferred method of the invention of removing the silicon nitride layer from above the surface of the gate electrodes and from in between the gate spacers and overlying the layer of ONO is an isotropic wet etch process using hot phosphoric acid. The silicon nitride layer 38 can also be dipped into phosphoric acid ($H_3PO_4$) to be removed.

As an alternate method, plasma damage (regions 30, FIG. 2, or regions 18, FIG. 1d) can be prevented by performing a partial dry etch for the etching of the spacers followed by wet etch for the completion of the etch of the gate spacers. The layer of silicon nitride (layer 38, FIG. 4) helps prevent the plasma damage during this alternative processing sequence.

Figure 7:
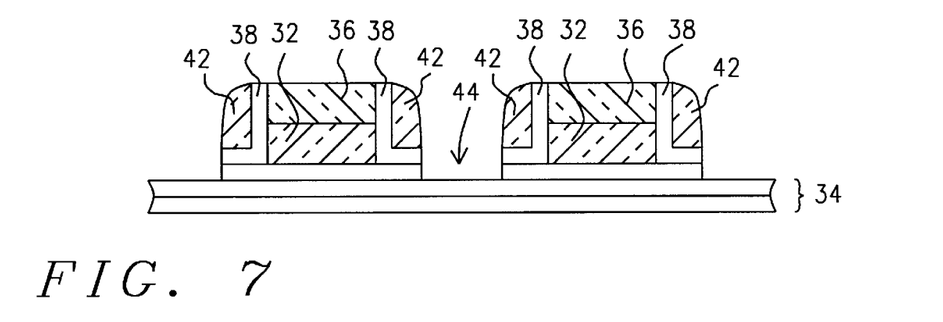
FIG. 7 shows a cross section after a buffer oxide etch (BOE) or HF wet dip.

FIG. 7 shows a cross section after the structure has been subjected to a buffer oxide etch (BOE) or HF wet dip. During this processing step, the wafer is placed in an oxidation environment, generally in steam at a high temperature such as 1100 degrees C. under atmospheric pressure for a time period of between 10 and 30 seconds. This process of buffer oxide etch (BOE) or HF wet dip crystallizes the exposed parts (of the top layer of oxide) of the layer of ONO after which the crystallized layer of oxide can be readily removed as part of the buffer oxide etch (BOE) or HF wet dip. The upper layer of oxide layer 34 of ONO is in this manner removed from the bottom of the holes 44 that exists between the gate electrodes.

FIG. 8 shows a cross section after the HTO has been re-deposited as layer 46 and a layer 48 of poly-2 has been deposited and patterned.

Typically, formation of silicon oxide films is performed by the process of dry oxidation at high temperatures of 800 degrees C. or more, or by a process of wet oxidation. During the process of wet oxidation, hydrogen is caused to combust in an oxygen atmosphere at a temperature of 700 degrees C. or more generating water vapor while oxidation occurs. The growth rate of the oxide film using wet oxidation is higher than the growth rate that can be achieved using dry oxidation. Wet oxidation is therefore more effective when forming oxide films at low temperatures when using conventional technology. However, in wet oxidation, since the combustion of hydrogen is carried out, the temperature must necessarily be that of the combustion of hydrogen, 700 degrees C. or more.

The process of the invention as highlighted above under FIGS. 3 through 8 has the following characteristics and provides the following advantages:

the layer of TEOS-1 acts as a hard mask for the layer of poly-1 while simultaneously acting as the inter-poly dielectric top layer the layers of poly-1 and poly-2 create the gate electrode whereby both layers have the same thickness of underlying layer of (ONO) gate oxide by using the layer of TEOS-1 as the top inter-poly dielectric layer, better oxide uniformity is assured for the layer of gate oxide the layers of silicon nitride and poly-2 serve as poly spacers while the layer of silicon nitride acts as inter-poly dielectric sidewalls the poly-2 is dry-etched to form the gate spacers while the layer of silicon nitride is wet etched to form the IPO layer the thickness of both the layer of silicon nitride on the gate sidewall and the thickness of the layer on the surface of the gate electrode can be adjusted and controlled by changing the thickness of the deposited layers of TEOS-1 and TEOS-2 and further by adjusting the spacer etch time, resulting in a (desired) decrease in the fringe field (of the gate electrode) and in a (desired) decrease in the IPO capacitance the thickness of the layer of TEOS-1 can be independently varied; by making this layer of TEOS-1 thicker, the poly-1 to poly-2 capacitance can be reduced the processes of the invention results in less plasma damage to the surface of the layers that make up the gate electrode structure during the processes of IPO dry etch and IPO wet etch the typical problem of the occurrence of residual poly-2 has been eliminated, thereby eliminating a source of electrical shorts between gate electrodes and their surrounding regions the process of the invention provides the means of creating layers of poly-1 and poly-2 that have equal thickness and sheet resistance, thereby allowing for the creation of gate electrodes whereby this characteristic is desired and of value such as the creation of matching clock devices.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A process of creating a second layer of poly-2 overlying a first layer of poly-1, said layer of poly-1 serving as a gate electrode structure having sidewalls, said second layer of poly-2 serving as a layer of overlying poly-2 for said gate electrode structure, comprising the steps of:

providing a semiconductor substrate;

depositing a layer of ONO over the surface of the semiconductor substrate, said layer of ONO comprising a lower layer of oxide over which a layer of nitride over which an upper layer of oxide;

depositing a layer of poly-1 over the surface of said layer of ONO;

depositing a layer of TEOS-1 over the surface of said layer of poly-1;

patterning said layer of TEOS-1 as a hard mask for the underlying layer of poly-1;

etching said layer of poly-1 using said hard mask as an etch mask, creating a pattern of gate electrodes, partially exposing the surface of said substrate;

depositing a layer of silicon nitride over said gate electrodes, including said partially exposed surface of said substrate;

depositing a layer of TEOS-2 over the surface of said layer of silicon nitride;

forming said layer of TEOS-2 as gate spacers on sidewalls of said gate electrodes;

removing said silicon nitride layer from above said gate electrodes and from between said gate spacers;

removing said upper layer of oxide of said layer of ONO from in between said gate spacers, partially exposing the surface of said layer of nitride contained within said layer of ONO;

depositing a layer of protective oxide over said gate electrodes, said gate spacers and said partially exposed surface of said layer of nitride contained within said layer of ONO; and depositing a layer of poly-2 over the surface of said protective oxide.

2. The method of claim 1, each gate electrode of said pattern of gate electrodes containing a layer of poly-1 over which said layer of TEOS-1 forming a top layer of inter-poly oxide (IPO), said gate electrodes having sidewalls in addition to having an upper surface, said layer of TEOS-1 having a thickness and an inter-surface parasitic capacitance, both parameters of thickness and capacitance being measured in a direction perpendicular to said surface of said substrate.

3. The method of claim 1, said layer of TEOS-1 being deposited to a thickness between about 2500 and 3500 Angstrom.

4. The method of claim 1, said patterned layer of TEOS-1 serving as a hard mask for said etching of said layer of poly-1 in addition to serving as a top layer of inter-poly oxide (IPO) dielectric for said upper surface of said patterned layer of poly-1, providing improved uniformity of thickness of said layer of IPO.

5. The method claim 1, said layer of poly-1 and said layer of poly-2 being layers of polysilicon applied in a gate electrode structure.

6. The method of claim 1, said layer of silicon nitride being deposited to a thickness of between about 250 and 350 Angstrom.

7. The method of claim 1, said layer of TEOS-2 being deposited to a thickness of between about 2500 and 3500 Angstrom.

8. The method of claim 1, said layer of silicon nitride together with said layer of TEOS-2, after said layers of silicon nitride and TEOS-2 have been deposited, patterned and etched, serving as IPO layers on said sidewalls of said gate electrodes, said IPO layers having a surface, further having a thickness in addition to having an inter-surface parasitic capacitance, both parameters of thickness and capacitance measured in a direction perpendicular to said surface of said IPO layer.

9. The method of claim 2, said thickness of said top IPO layer of TEOS-1 for said upper surface of said gate electrode being adjusted with objective of decreasing gate spacers width, decreasing electromagnetic fringe field strength of said gate electrode and improving gate electrode device performance.

10. The method of claim 2, said thickness of said top IPO layer of TEOS-1 for said upper surface of said gate electrode being adjusted, increasing said thickness of said TEOS-1 layer with as objective decreasing said parasitic capacitance of said IPO layer of TEOS-1 of said gate electrode, improving gate electrode high-frequency device performance.

11. The method of claim 8, said thickness of said IPO layer overlying said sidewalls of said gate electrodes being adjusted, decreasing gate spacers width with as objective of decreasing electromagnetic fringe field strength of said gate electrode and improving gate electrode device performance.

12. The method of claim 8, said thickness of said IPO layer overlying said sidewalls of said gate electrodes being adjusted, increasing said thickness of said IPO layer with as objective of decreasing said parasitic capacitance of said IPO layer overlying said gate spacers, improving gate electrode device high-frequency performance.

13. The method of claim 1, said thickness of said layers of TEOS-1 and said layer of TEOS-2 being determined by either varying deposition time of said layers of TEOS-1 and TEOS-2 or by varying etch time for said layers of TEOS-1 and TEOS-2 .

14. The method of claim 1, said thickness of said layer of TEOS-1 being equal to said thickness of said layer of TEOS-2, enabling creation of gate electrodes for which clock matching performance characteristics are assured.

15. A process of creating a second layer of poly-2 overlying a first layer of poly-1, said layer of poly-1 serving as a gate electrode structure having sidewalls, said second layer of poly-2 serving as a layer of overlying poly-2 for said gate electrode structure, comprising the steps of:

providing a semiconductor substrate;

depositing a layer of ONO over surface of said semiconductor substrate, said layer of ONO comprising a lower layer of oxide over which a layer of nitride over which an upper layer of oxide;

depositing a layer of poly-1 over the surface of said layer of ONO;

depositing a first layer of dielectric over said layer of poly-1;

patterning said first layer of dielectric, creating a hard mask for etching of the first layer of dielectric;

etching said layer of poly-1 using said hard mask as an etch mask, creating a pattern of gate electrodes, partially exposing the surface of said substrate;

depositing a layer of etch stop over said gate electrodes, including said partially exposed surface of said substrate;

depositing a second layer of dielectric over the surface of said layer of etch stop;

dry etching said second layer of dielectric using said layer of etch stop as an etch stop, forming gate spacers on sidewalls of said gate electrodes;

removing said layer of etch stop from above said gate electrodes and from between said gate spacers by a wet etch;

performing a buffer oxide etch (BOE) or HF wet dip, removing said upper layer of oxide of said layer of ONO from in between said gate spacers, partially exposing said layer of nitride contained within said layer of ONO;

performing a High Temperature Oxidation (HTO), creating a layer of protective oxide over said gate electrodes, said gate spacers and said partially exposed surface of said layer of nitride contained within said layer of ONO; and depositing a layer of poly-2 over said protective oxide.

16. The method of claim 15, said first layer of dielectric comprising TEOS.

17. The method of claim 15, said second layer of dielectric comprising TEOS.

18. The method of claim 15, said layer of etch stop comprising silicon nitride.

19. The method of claim 15, each gate electrode of said pattern of gate electrodes containing a layer of poly-1 over which said first layer of dielectric forming a top layer of IPO for said gate electrodes, said gate electrodes having sidewalls in addition to having an upper surface, said first layer of dielectric having a thickness and an inter-surface parasitic capacitance, both parameters of thickness and capacitance being measured in a direction perpendicular to said surface of said substrate.

20. The method of claim 15, said first layer of dielectric being deposited to a thickness between about 2500 and 3500 Angstrom.

21. The method of claim 15, said patterned first layer of dielectric serving as a hard mask for said etching of said layer of poly-1, in addition to serving as a top layer of inter-poly oxide (IPO) dielectric for said patterned layer of poly-1, providing improved uniformity of thickness of said layer of IPO.

22. The method claim 15, said layer of poly-1 and said layer of poly-2 being layers of polysilicon applied in a gate electrode structure.

23. The method of claim 18, said layer of silicon nitride being deposited to a thickness of between about 250 and 350 Angstrom.

24. The method of claim 17, wherein said second layer of dielectric being deposited to a thickness of between about 2500 and 3500 Angstrom.

25. The method of claim 15, said layer of etch stop together with said second layer of dielectric serving, after said layers of etch stop and said second layer of dielectric have been deposited, patterned and etched, as IPO layers on sidewalls of said gate electrodes, said IPO layers having a surface, further having a thickness in addition to having an inter-surface parasitic capacitance, both parameters of thickness and capacitance being measured in a direction perpendicular to said surface of said IPO layer.

26. The method of claim 19, said thickness of said first layer of dielectric overlying said sidewalls of said gate electrodes being adjusted, decreasing gate spacers width, with as objective of decreasing electromagnetic fringe field strength of said gate electrode and improving gate electrode device performance.

27. The method of claim 19, said thickness of said top thickness of said first layer of dielectric being adjusted, increasing said thickness of said first layer of dielectric, with as objective decreasing said parasitic capacitance of said first layer of dielectric of said gate electrode, improving gate electrode high-frequency device performance.

28. The method of claim 25, said thickness of said IPO layer overlying said sidewalls of said gate electrodes being adjusted, decreasing gate spacers width, with as objective of decreasing said strength of said electromagnetic fringe field of said gate electrode, improving gate electrode device performance.

29. The method of claim 25, said thickness of said IPO layer overlying said sidewalls of said gate electrodes being adjusted, increasing said thickness of said IPO layer, with as objective of decreasing said parasitic capacitance of said IPO layer overlying said gate spacers, improving gate electrode device high-frequency performance.

30. The method of claim 15, a thickness of said first layer of dielectric and said second layer of dielectric being determined by either varying deposition time of said first and second layers of dielectric or by varying etch time for said first and second layers of dielectric.

31. The method of claim 15, a thickness of said first layer of dielectric being equal to a thickness of said second layer of dielectric, enabling creation of gate electrodes for which clock matching performance characteristics are assured.

32. The method of claim 1, said dry etching said layer of TEOS-2 using said layer of silicon nitride as an etch stop being a partial dry etch followed by a wet etch, forming gate spacers on sidewalls of said gate electrodes.

33. The method of claim 1 with the additional step of etching said deposited layer of poly-2, forming patterned overlying layers of poly-1 and poly-2 for the creation of gate electrodes.

34. The method of claim 15, said dry etching said second layer of dielectric using said layer of silicon nitride as an etch stop being a partial dry etch followed by a wet etch, forming gate spacers on sidewalls of said gate electrodes.

35. The method of claim 15 with the additional step of etching said deposited second layer of dielectric, forming patterned overlying layers of poly-1 and poly-2 for the creation of gate electrodes.

* * * * *